US009899087B1

(12) United States Patent
Hokenmaier et al.

(10) Patent No.: US 9,899,087 B1
(45) Date of Patent: Feb. 20, 2018

(54) CONTENT ADDRESSABLE DYNAMIC RANDOM-ACCESS MEMORY WITH PARALLEL SEARCH FUNCTIONALITY

(71) Applicant: Green Mountain Semiconductor Inc., Burlington, VT (US)

(72) Inventors: Wolfgang Hokenmaier, Burlington, VT (US); Ryan A. Jurasek, Burlington, VT (US); Donald W. Labrecque, Colchester, VT (US); Aaron D. Willey, South Burlington, VT (US)

(73) Assignee: Green Mountain Semiconductor Inc., Burlington, VT (US)

( * ) Notice: Subject to any disclaimer, the term of this patent is extended or adjusted under 35 U.S.C. 154(b) by 0 days.

(21) Appl. No.: 15/345,494

(22) Filed: Nov. 7, 2016

Related U.S. Application Data (60) Provisional application No. 62/252,042, filed on Nov. 6, 2015.

(51) Int. Cl.
*G11C 11/56* (2006.01)
*G11C 15/04* (2006.01)
*G11C 11/4091* (2006.01)
*G11C 11/4094* (2006.01)

(52) U.S. Cl.
CPC ........ *G11C 15/043* (2013.01); *G11C 11/4091* (2013.01); *G11C 11/4094* (2013.01); *G11C 11/56* (2013.01); *G11C 11/565* (2013.01); *G11C 11/5692* (2013.01)

(58) Field of Classification Search
CPC .... G11C 11/56; G11C 11/565; G11C 11/5692
USPC .......................................... 365/168
See application file for complete search history.

(56) References Cited

U.S. PATENT DOCUMENTS

2015/0294710 A1\* 10/2015 Onuki .................. G11C 7/1069
365/149

\* cited by examiner

*Primary Examiner* — Jason Lappas
(74) *Attorney, Agent, or Firm* — Downs Rachlin Martin PLLC (57) ABSTRACT

An extremely dense, high speed, and low power content addressable DRAM is presented. To enable a parallel searching, a data word to be searched may be driven onto column select lines (CSLs) of a DRAM array. Although two or more primary sense amplifiers typically are not connected at the same time to the same local data line during operation of a DRAM, in various embodiments presented herein, some or all sense amplifiers in a DRAM can be activated simultaneously to enable maximum parallelism with local data line sharing being explicitly allowed. Using this architecture, a data word can be simultaneously searched in all banks and with multiple wordlines. Since no input/output transactions are required and no data needs to be driven from the bank during execution of a search, overall current, and thus power usage, can be reduced.

17 Claims, 9 Drawing Sheets

CONTENT ADDRESSABLE DYNAMIC RANDOM-ACCESS MEMORY WITH PARALLEL SEARCH FUNCTIONALITY

RELATED APPLICATION DATA

This application claims the benefit of priority of U.S. Provisional Patent Application Ser. No. 62/252,042, filed on Nov. 6, 2015, and titled "CONTENT ADDRESSABLE DRAM FOR HIGHLY PARALLEL SEARCH," which is incorporated by reference herein in its entirety.

FIELD OF THE INVENTION

The present invention generally relates to the field of memory storage in computer systems. In particular, the present invention is directed to content addressable dynamic random-access memory with parallel search functionality.

BACKGROUND

The ability to quickly and intelligently interpret large data sets is a basic asset in the modern computing environment. To that end, various modern databases provide optimized structures that enable and accommodate quick and efficient searching. In an effort to reduce latency, it has been suggested that databases, or portions thereof, may be stored in dynamic random-access memory (DRAM) rather than in storage media such as hard drives or SSD flash drives, as DRAM has a much lower latency than many other common types of storage media. This approach can, indeed, increase the performance of a database; however, a nontrivial amount of power is typically required to drive data off of the DRAM to a processor, e.g., for comparison during the execution of a search query. Thus, there is a need for new memory architectures and methods to improve upon the current state of the art.

SUMMARY OF THE DISCLOSURE

In one aspect, the present disclosure is directed to providing search functionality in a DRAM memory. In some implementations, the search functionality is capable of comparing one or more portions of a data word with a large dataset quickly and efficiently by utilizing a highly parallel search.

In one implementation, the present disclosure is directed to a content addressable dynamic random-access memory with parallel search functionality that includes a plurality of dynamic random-access memory cells associated with a plurality of sense amplifiers, and a plurality of select lines connected to the plurality of sense amplifiers, wherein the sense amplifiers are configured to be selectively simultaneously connected to a shared line and select line activation is performed as a function of a search query.

In another implementation, the present disclosure is directed to a method of controlling a content addressable dynamic random-access memory with parallel search functionality and a plurality of dynamic random-access memory cells. The method includes driving a plurality of select lines connected to a plurality of sense amplifiers, wherein the sense amplifiers are configured to simultaneously connect to and selectively drive a shared line and performing select line activation as a function of a search query.

In yet another implementation, the present disclosure is directed to a machine-readable storage medium containing machine-executable instructions for performing a method of controlling content addressable dynamic random-access memory with parallel search functionality and a plurality of dynamic random-access memory cells. The machine-executable instructions include a first set of machine-executable instructions for driving a plurality of select lines connected to a plurality of sense amplifiers, wherein the sense amplifiers are configured to simultaneously connect to and selectively drive a shared line and a second set of machine-executable instructions for performing select line activation as a function of a search query.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Search latency and power consumption typically increase linearly with increases in the amount of data to be searched when search algorithms are performed using a traditional processor and traditional memory. The present inventors have discovered that in order to meet the demands of impatient users and real-time systems and to efficiently deal with large data sets, a new type of content addressable dynamic random-access memory (DRAM) with parallel search functionality can be used. In some implementations, search queries may be executed quickly and efficiently without having to shuttle large amounts of data between a processor and a separate memory. The in-memory search capability reduces transmissions between a processor and a content addressable DRAM made in accordance with the teachings of the present disclosure to the search word and the search result, thereby eliminating the power consumption and resource drain associated with data transfer for search operations.

Aspects of the disclosure include memory architectures and methods for executing search queries in a content addressable DRAM memory, thereby significantly reducing power usage of input/output procedures while offering better overall search performance. This may enable one or more processors (e.g., central processing units and/or graphics processing units, among others) to perform other tasks while a search is under way in memory and/or to utilize reduced clock rates in order to reduce power consumption. In some embodiments, system architects may be able to utilize lower memory input/output frequencies, lower numbers of processors or processing cores, and/or lower clock rates for processors, depending on the demands on these components in a given implementation, which in turn can reduce cost and/or power consumption for the overall system while maintaining the capability to search large databases at performances well beyond the current state of the art.

Figure 1:
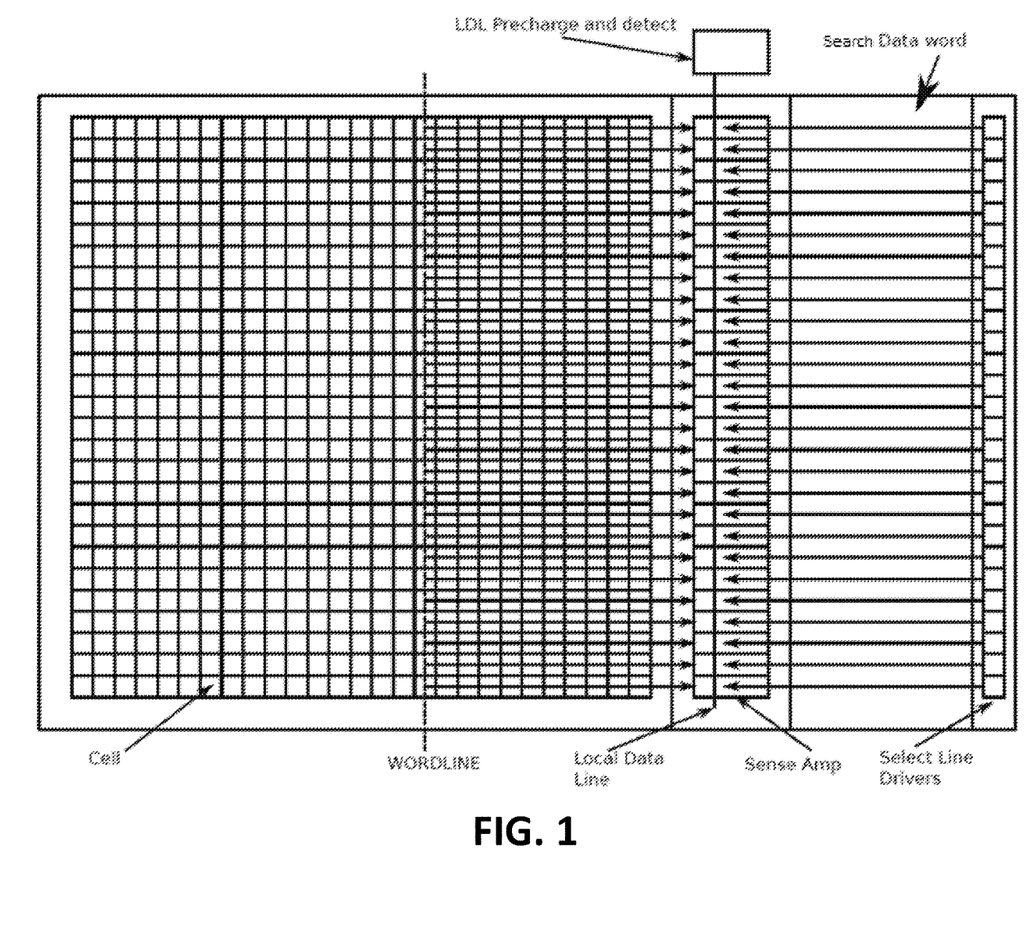
FIG. 1 is a diagram of an example content addressable dynamic random-access memory with parallel search functionality.

Aspects of the present disclosure can be used to implement standalone, embedded, or complementary systems, among others, that can quickly and easily execute search queries across vast data sets. Although aspects of the present disclosure are directed to content addressable DRAM memory, practical uses of the inventive subject matter disclosed herein can extend far beyond DRAM integrated circuits. For example, a central processing unit, video processing unit, or other computing device may be developed or modified to take advantage of the teachings disclosed herein. Further, self-driving vehicles, manually or semi-automatedly controlled vehicles, power generation or distribution systems, security systems, and/or a vast array of other large, complex systems may take advantage of the teachings provided herein, as will be appreciated by those of ordinary skill in the art after reading this disclosure in its entirety. FIG. 1 illustrates one section of an array of DRAM memory cells and associated circuitry showing how precharge and detect circuitry can be used to precharge a local data line (LDL), a search word can be pulsed on column select lines (CSLs), and the precharge and detect circuitry can then detect the effect of the search data word on the LDL. Using this sort of architecture, search functionality can be implemented within a component containing DRAM such that external devices may perform searches of information on the component simply by providing a search query, after which the component can simply return the addresses of matched data in the DRAM or data associated with the match (e.g., returning a birth date associated with a name searched and found in memory). Through use of this architecture, large data transfers between a processor and separate memory can be eliminated, thus reducing power requirements for searching the data stored in the DRAM. Further, in contrast with most data searching solutions, the efficiency of searching may increase with the amount of available memory, whether on the same chip or separate chips, provided each chip enables at least some of the functionality described herein. The maximum search time of a system may be largely or completely independent of the number of processors and how much data needs to be processed when DRAM devices made in accordance with the teachings of the present disclosure are used to store the data to be searched.

Figure 2:
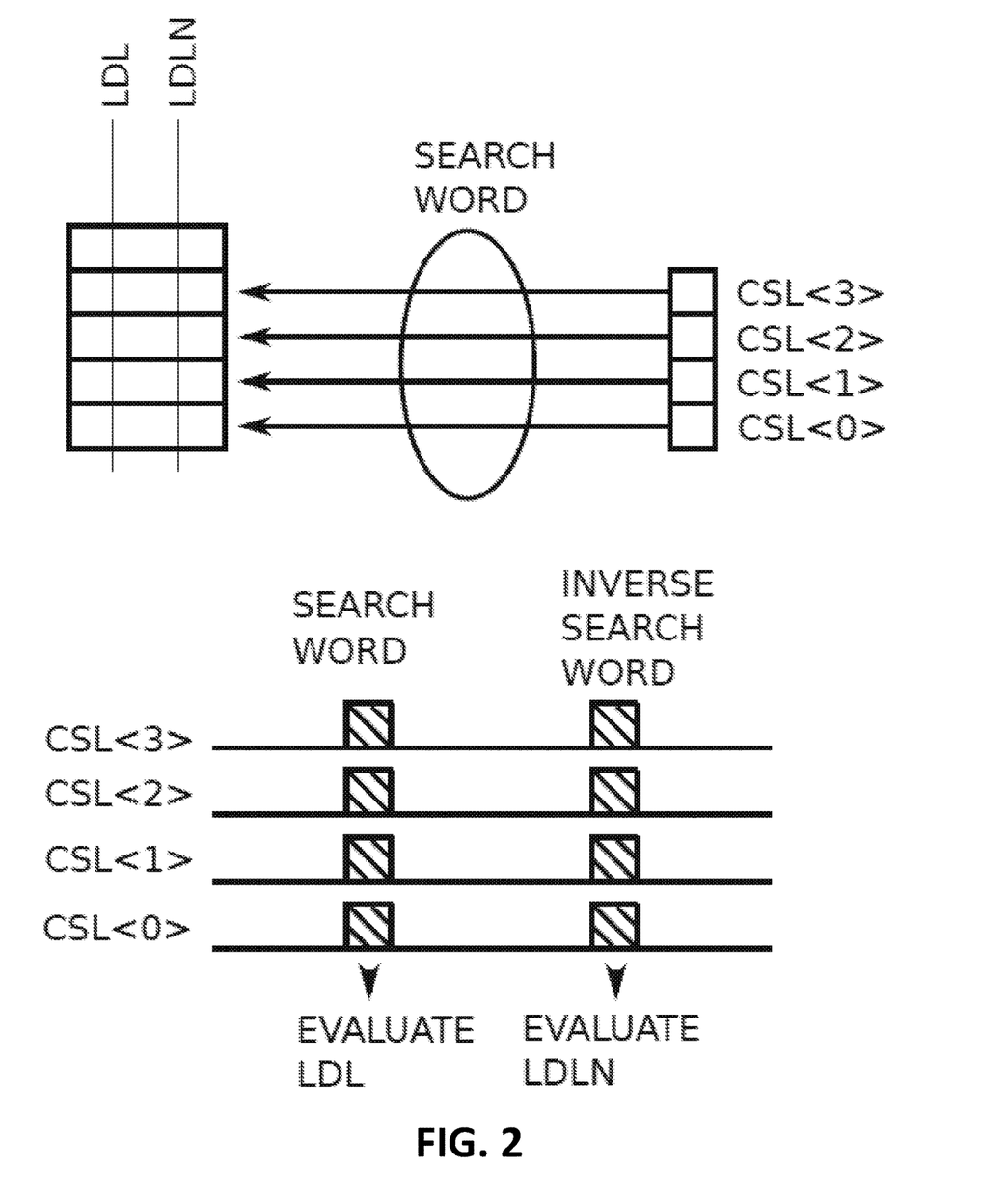
FIG. 2 illustrates an example of how a search word may be applied to column select lines, including a timing diagram showing when local data lines may be evaluated, in order to execute a binary parallel search.
Figure 3:
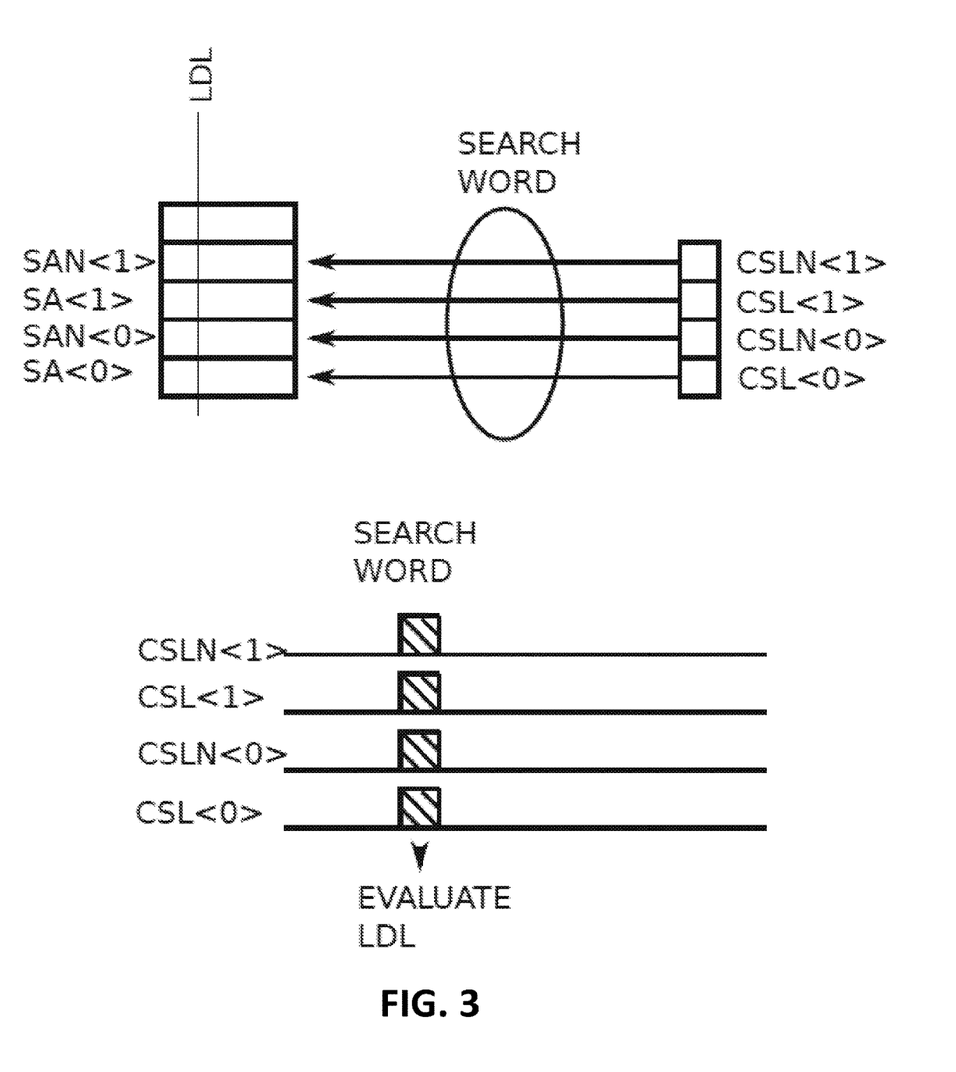
FIG. 3 illustrates an example of how a search word may be applied to column select lines, including a timing diagram showing when local data lines may be evaluated, in order to execute a ternary parallel search.

To accomplish a search using an architecture like that shown in FIG. 1, a data word may be provided to the component containing the illustrated DRAM components. The data word may then be driven to all banks in the DRAM simultaneously such that all banks can be searched simultaneously, as data does not need to be returned from each bank until the search is complete. When a search is initiated, one or more wordlines may be activated per bank. In some embodiments, the maximum number of activated wordlines may correspond to the number of primary sense amplifiers that can be activated at once. Each LDL that connects the output of one or more of the multiple primary sense amplifiers may then be precharged high. The data word may then be driven onto each CSL as a pulse or series of pulses. In a simple implementation, the CSLs may all start at logical zero as shown in FIG. 2, transition to requisite data word necessary to execute the search query for a single set period, and then return to zero. The LDL may then be sensed to determine whether it had discharged. The LDL would discharge if any of the CSLs that pulsed to a logical "1" were applied to a sense amplifier with its data set to a logical zero. The inverted data line signal LDLN may then be precharged high and the inverse of the data word may be driven onto the CSLs; under these conditions, LDLN would discharge if any of the CSLs that pulsed to a logical "1" were applied to a sense amplifier with its data set to a logical "1." If neither of LDL and LDLN discharge, then a match was found. A signal can then be driven back to the component requesting execution of the search query to indicate that the queried data was found and to provide one or more addresses of memory locations associated with (e.g., storing) that data. The search can continue through a plurality of row activations until the desired amount of data has been searched or a hit (or match) is detected.

DRAM memory must be refreshed on a regular basis in order to retain data. During execution of refresh commands, two or more (and typically many more) word lines are typically activated in parallel, thus transferring the signals stored by two or more memory cells into corresponding sense amplifier latches. Accordingly, in some embodiments (e.g., low power implementations), search queries may be executed in connection with and/or during memory refresh operations, utilizing the fact that data is typically already present in the plurality of sense amplifiers. In typical DRAM implementations, no CSLs would be activated during refresh and the LDLs remain precharged. However, by utilizing aspects of the present disclosure, a highly parallel search can be performed simultaneously with the refresh operation. If higher latencies can be tolerated for one or more search operations, those operations may be executed exclusively during refresh operations. Similarly, in some embodiments, search operations may be executed during refresh operations when the chip or component is in standby mode.

In some embodiments, DRAM memory cells may be partitioned into banks. For example, one bank might perform internally controlled search operations using highly parallel structures, e.g., as disclosed herein, while one or more other banks may simultaneously, synchronously, and/or asynchronously execute standard DRAM operations. If one or more searchable banks enable searching outside of refresh operations, search latency can be reduced, e.g., while other memory banks may perform standard DRAM operations. In some embodiments, one or more memory banks or portions of memory banks of a component implemented in accordance with the teachings of the present disclosure may accommodate one or more identical and/or one or more bank-specific commands that can be executed synchronously or asynchronously. In some embodiments, the commands may be executed by all memory banks simultaneously and/or separate commands may be executed by independently operable memory banks, which may share the same clock signal, run on different clock signals, and/or operate asynchronously. System level performance and resource utilization can thus be maximized using aspects of the disclosure, because in some implementations search operations may leave resources such as a data bus and/or one or more central processing units and/or graphics processing units, among other components, free to perform other operations.

To configure a ternary content addressable memory, two DRAM cells can be used for each bit: one cell containing the true value and a second cell containing the complement or inverse value. Evaluation of a ternary content addressable DRAM may be similar to that described above for binary queries, except only one pulse on the CSL may be required for evaluation. During a row activate, both the true and complement data cell may be sensed. An LDL may be precharged and a true and complement CSL may then be pulsed to the true and complement data, respectively, being held in each primary sense amplifier. In this scenario, the LDL may only discharge if the sense amplifier has its data set to a logical zero and the CSL connected to that sense amplifier is pulsed to a logical "1." The advantage of such a ternary content addressable DRAM is that a "don't care" state can be stored by setting both the true and the complement cell to logical "1." This way, the CSL will not be discharged when connected to this cell, preventing that cell from causing a hit to be detected.

Figure 4:
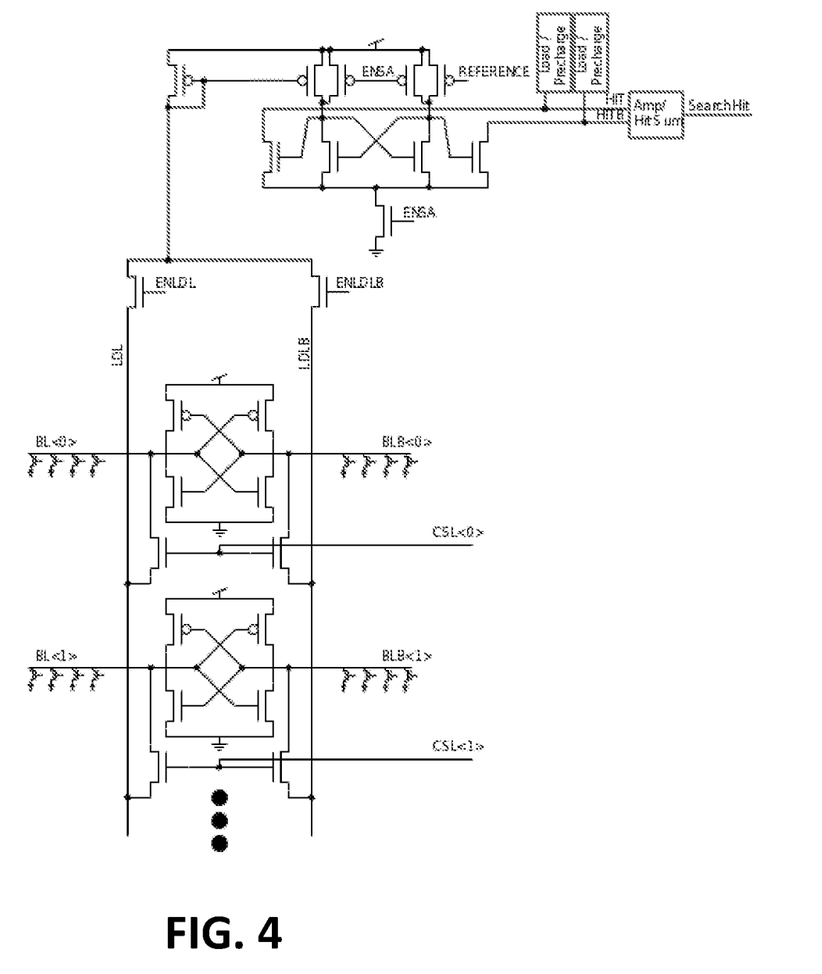
FIG. 4 is a schematic diagram of an example content addressable dynamic random-access memory with parallel search functionality using a reference signal.
Figure 5:
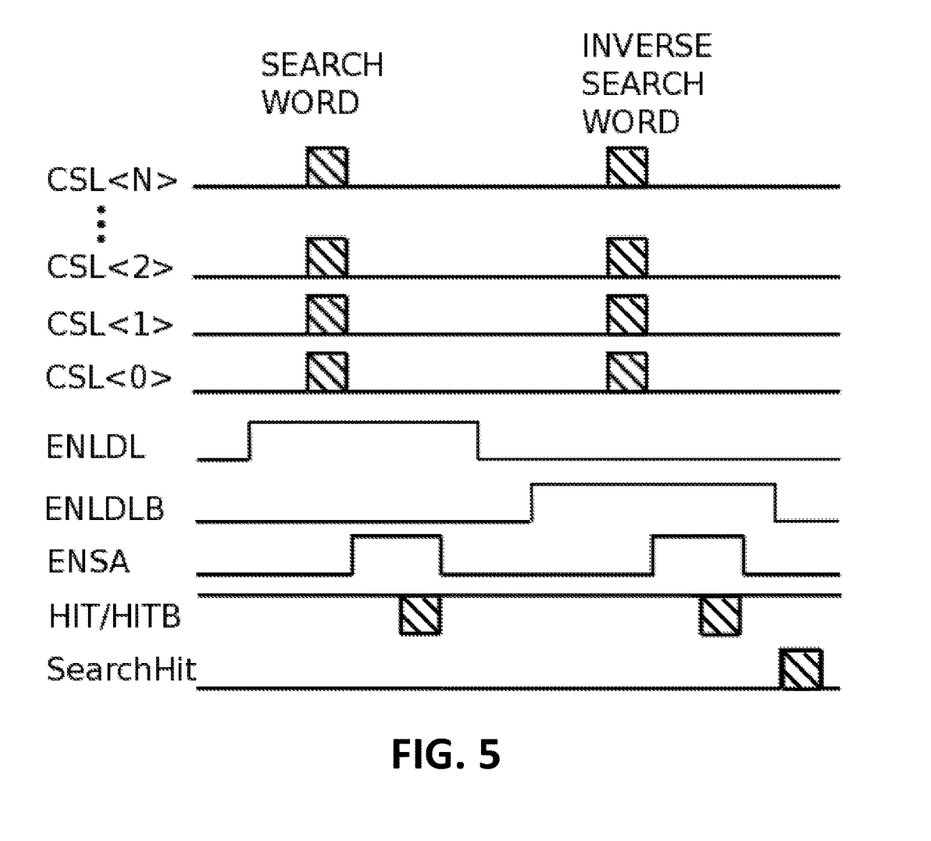
FIG. 5 is a timing diagram showing an example of how a search word may be applied to column select lines of the memory of FIG. 4 in order to execute a binary parallel search.

FIG. 4 provides an example of a content-addressable DRAM including a hit detect amplifier, primary sense amplifier, CSLs, bit switches, and other components that will be readily appreciated and understood by those of ordinary skill in the art after reading this disclosure in its entirety. FIG. 5 shows how a search word may be applied to column select lines of the memory of FIG. 4 in order to execute a binary parallel search, as well as how other signals may be applied in order to generate search hit signals. In the example implementation of FIG. 4, a DC reference signal ("REFERENCE") is always applied. The reference signal has a DC voltage that produces a current through the associated PFET in the hit detect amplifier. In some embodiments, this current may be designed to be approximately halfway between the current through the LDL when there is a hit (e.g., no CSL pulls the LDL down) and the current through the LDL when there is only one bit in the search data word that does not match the data in the sense amplifiers (e.g., only one CSL is given an opportunity to pull the LDL down).

In some embodiments, the search cycle may begin by enabling the LDL to connect to the hit detect amplifier (e.g., signal ENLDL set to logical "1"). The search word may then be pulsed onto the CSLs at a voltage that is low enough not to disturb the primary sense amplifier. After a predetermined amount of time, the hit detect amplifier may then be enabled (e.g., ENSA set to logical "1" for a short period). The amplifier may then determine whether there was a hit (match) or miss (mismatch), and that information may be returned to the "Amp/Hit Sum" block, which may amplify and/or store the result. The sense amplifier may then be disabled (e.g., ENLDL set to logical zero) and the procedure may be repeated for the LDLN side, with the exception that the search word may be inverted to enable the identification of zeros in the search word. After a predetermined amount of time, the hit detect amplifier may then be enabled (e.g., ENSA set to logical "1" for a short period). The amplifier may then determine whether there was a hit or miss, and that information may be returned to the "Amp/Hit Sum" block, which may again amplify and/or store the result. If both the LDL and LDLN sides produce hits, then a true hit signal ("SearchHit") is generated, as this indicates that matching data has been found. However, if one or both of the LDL and LDLN sides fail to produce a hit, then no true hit signal will be generated.

Figure 6:
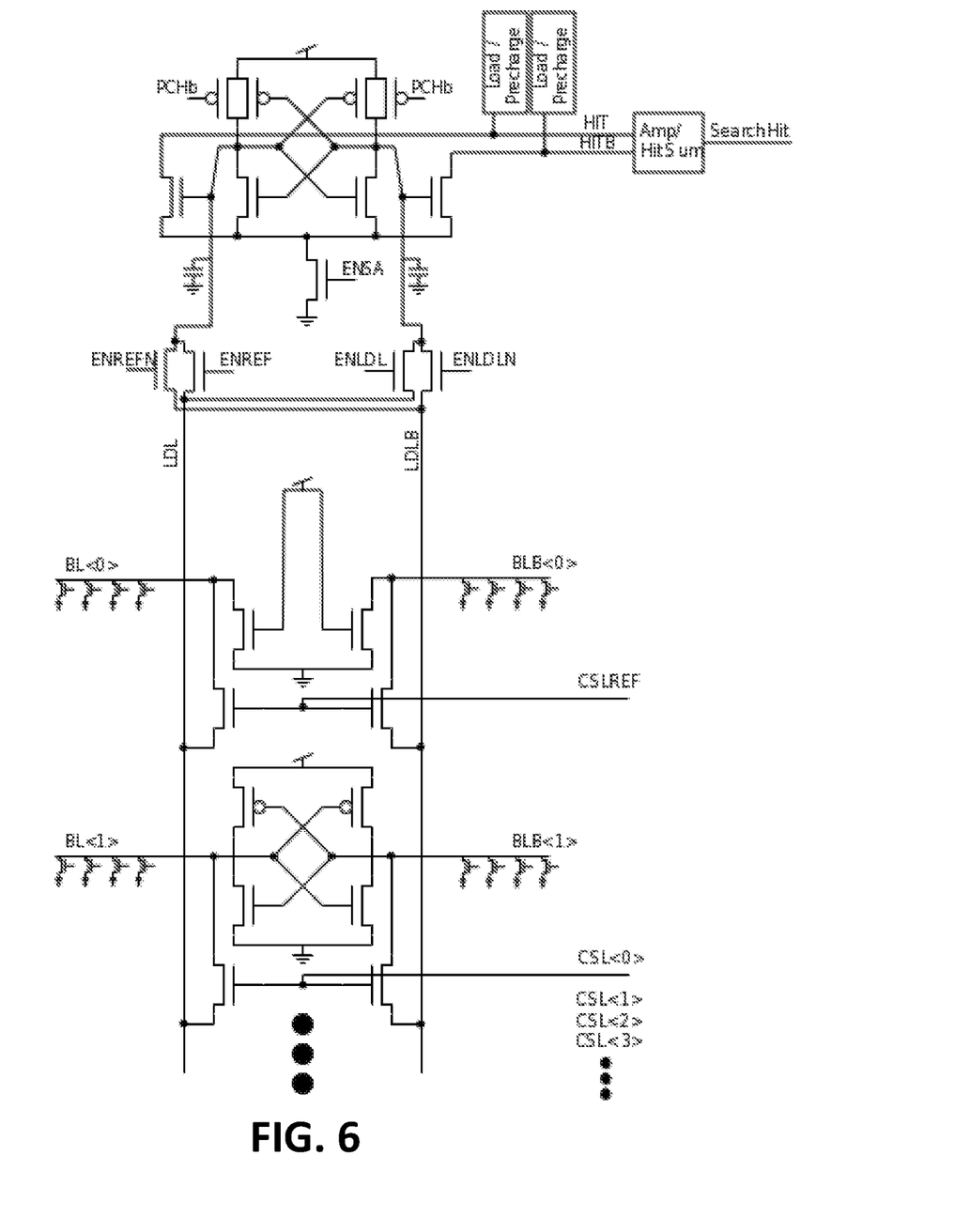
FIG. 6 is a schematic diagram of an example alternative content addressable dynamic random-access memory with parallel search functionality that does not require the use of a reference signal like that of FIG. 4.
Figure 7:
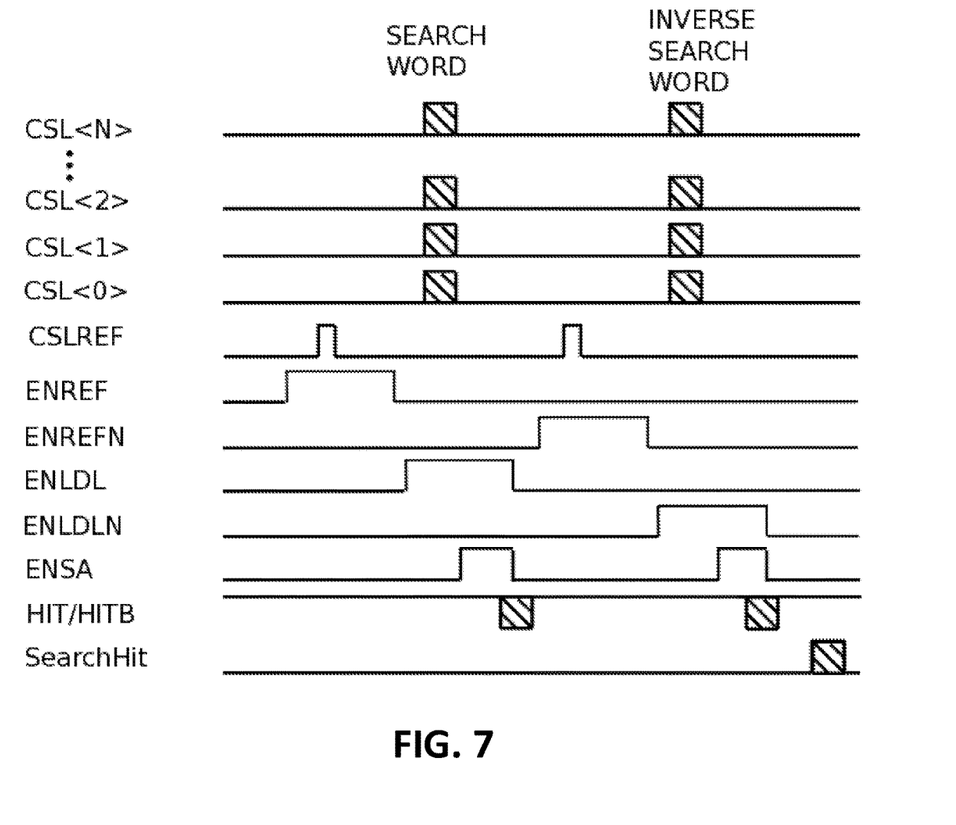
FIG. 7 is a timing diagram showing an example of how a search word may be applied to column select lines of the memory of FIG. 6 in order to execute a binary parallel search.

FIG. 6 provides an example of an alternative content-addressable DRAM that does not require the use of a reference signal like that of FIG. 4, including a hit detect amplifier, primary sense amplifier, CSLs, bit switches, and other components that will be readily appreciated and understood by those of ordinary skill in the art after reading this disclosure in its entirety. FIG. 7 shows how a search word may be applied to column select lines of the memory of FIG. 6 in order to execute a binary parallel search, as well as how other signals may be applied in order to generate search hit signals. In this example implementation, the reference signal used in the embodiment of FIG. 4 is generated as a function of a CSL pulse. In order to produce the reference, a first dummy CSL ("CSLREF") may be pulsed to pull the LDL down. The CSLREF signal may be pulsed for a shorter time than normal CSLs so that a reference can be sampled on the opposite side of the amplifier. By pulsing the CSLREF signal for a shorter period, the LDL may not be pulled down as far as a normal CSL may pull it down. In this case, the LDL and associated circuitry may be designed to produce a voltage approximately halfway between the voltage on the LDL when there is a hit (e.g., no CSL pulls the LDL down) and the voltage on the LDL when there is only one bit in the search data word that does not match the data in the sense amplifiers (e.g., only one CSL is given an opportunity to pull the LDL down).

As shown in FIG. 7, the pulse length for the CLSREF signal may be 1 ns, while a pulse length of 2 ns may be used for normal CSL activations. The signal "ENREF" may be enabled (which, for the sake of completeness, would also cause ENREFN to be set to logical "0") to short one side of the amplifier to the LDL and sample the voltage on a capacitor, which may have a predetermined, particular voltage or a voltage resulting from parasitic capacitance. After the reference has been sampled, ENREF may be disabled and the opposite LDL (here, LDLB) may be selected for analysis (e.g., ENLDL may be set to logical "1," which, for the sake of completeness, would also cause ENLDLN to be set to logical "0") and the CSLs may be pulsed with the search data word and the resulting voltage on the LDLB sampled. After both voltages have been sampled, the hit detect amplifier may then be enabled (e.g., by "disabling" PCHb and "enabling" ENSA, i.e., bringing both to a "high" or logical "1" value) to determine whether a hit was detected. The procedure may then be repeated for the LDL side and the results of the two resulting hit signals can be summed to produce a true hit (or miss) signal ("SearchHit").

Figure 8:
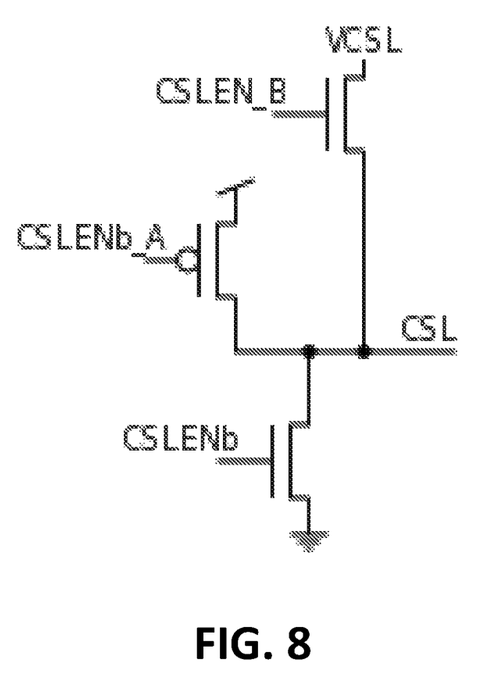
FIG. 8 is a schematic diagram of a column select line driver circuit that may be used in a content addressable dynamic random-access memory with parallel search functionality.

FIG. 8 shows a CSL driver circuit that may be used to drive a high voltage for normal CSL activation and a lower voltage for search operations in any one or more of the embodiments disclosed herein. To enable the CSL for a normal write or read (higher voltage) the signals "CSLENb," "CSLENb_A," and "CSLEN_B" are all driven low. This disables the pull-down NFET and pull-up NFET while enabling the pull up PFET, connecting the CSL to the power supply. To enable the CSL for a search operation (lower voltage), the signals CSLENb_A and CSLEN_B are driven high while CSLENb is driven low. This disables the pull-down NFET and pull-up PFET while enabling the pull up NFET. To deselect or disable the CSL, CSLENb and CSLEN_bA are driven high, while CSLEN_B is driven low.

This disables both the NFET and PFET pull-up devices, while enabling the NFET pull down device.

Figure 9:
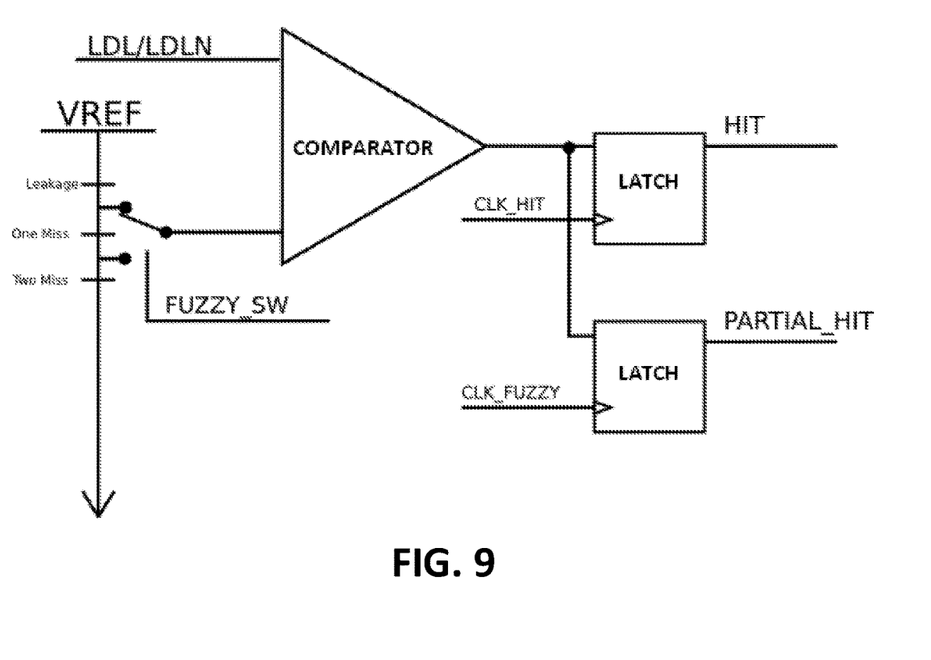
FIG. 9 is a schematic diagram of an example of a hit detect circuit that allows for partial hit detection.

In many search applications, it is desirable to identify partial matches to a search term. For example, an individual's name might be misspelled in the data stored in memory, and so it may be desirable to identify partial matches in order to find matches in spite of such misspellings. In another important example, DNA sequencing algorithms depend heavily on matching of DNA strands to approximate matches, as reference databases are typically generated using DNA of different individuals and the DNA information extraction process is inherently inexact. FIG. 9 shows an alternative hit detect circuit where the search function allows for a partial hit detection. Using the circuit of FIG. 9, rather than looking for an exact match, a search can allow for one or more bits of the search word to be opposite of the expected value. This is also known as a fuzzy search. The circuit of FIG. 9 may be used in addition to or in place of the hit detect circuitry shown in FIGS. 4 and/or 6; however, in this case, the reference level may be modified such that the comparator (or hit detect amplifier) will allow for one or more missed bits to still produce a "hit detect" signal on the output of the comparator. A switch actuated by the signal ("FUZZY_SW") can switch between a first reference voltage and a second voltage. The first reference voltage may have a voltage between the voltage of LDL or LDLb when a hit has been identified (accounting for leakage) and the voltage produced when there is only one bit in the search data word that does not match the data in the sense amplifiers (e.g., only one CSL is given an opportunity to pull the LDL down). The second voltage may have a voltage between the "one bit unmatched" voltage and the voltage on LDL or LDLb when there are two bits in the search data word that do not match the data in the sense amplifiers. This allows for two results to be stored in the output latches, which may be clocked by the "CLK_HIT" and "CLK_FUZZY" signals. Initially, the signal "FUZZY_SW" may actuate the switch to the first reference voltage, which will render an exact hit detect result at the output of the comparator (whether high or low) and the result will be stored in a first latch as a function of the "CLK_HIT" signal and then output as signal "HIT". Then the signal "FUZZY_SW" may actuate the switch to the second voltage. This second voltage will render a partial hit result at the output of the comparator that will be stored in a second latch as a function of the "CLK_FUZZY" signal and output as signal "PARTIAL HIT".

A multiplicity of variations of the partial hit detect functionality discussed herein will be readily realizable by those of ordinary skill in the art after reading this disclosure in its entirety. The partial hit detect functionality can be easily modified to allow for partial hits of any number of bits, such as two or more. Also, by employing multiple comparators in parallel with different reference voltages, it is possible to simultaneously detect exact and partial hits or multiple variations of partial hits, e.g., a mismatch of two or more single bits. In the same way, it is possible to omit some of the circuitry and implement only one partial hit search, where for example one bit is always allowed to be a "miss" and an exact hit match is not separately detected. In such an implementation, the switch "FUZZY_SW" of FIG. 9 may be omitted, the reference level may be set to a fixed target value in accordance with the number of missed bits that can be tolerated for a hit, a single output signal (e.g., "PARTIAL_HIT") may be generated, and one or both of the latches in FIG. 9 may be omitted.

In connection with FIG. 9, the reference level or levels for partial hit detection may be used with one or more of the hit detection circuits of FIGS. 4 and 6. For partial hit detection, with reference to, e.g., FIG. 4, the reference levels may be generated through a resistor ladder and have fixed values, which may be trimmable and compensated for process, voltage, and temperature changes. For partial hit detection, with reference to e.g., FIG. 6, the CSLREF pulse-width may be modified such that the reference voltage falls between levels expected for desired numbers of missed bits. For example, if the regular CSLs (CSL<0>, <1>, . . . ) are pulsed high for 2 ns during hit detection, then by first pulsing CSLREF for 3 ns, the trigger level for the hit detect amplifier can be set between one and two missed bits. In this situation, the "SearchHit" signal of FIG. 6 would have a logical "high" value if all bits match or if only one bit is mismatched and it would have a logical "low" value if two or more bits are mismatched.

By utilizing the architecture and/or teachings described herein, quicker, more efficient search queries can be executed in parallel across multiple different DRAM banks and/or components containing DRAM. A minimal set of devices used to implement aspects of the present disclosure may include a DRAM array, a set of sense amplifiers with select lines, a data line to connect the output of the sense amplifiers together, and some circuitry to precharge the data line and sense the voltage on the data line (see, e.g., FIGS. 4 and 6).

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A content addressable dynamic random-access memory with parallel search functionality, comprising:
   a plurality of dynamic random-access memory cells associated with a plurality of sense amplifiers; and
   a plurality of select lines connected to the plurality of sense amplifiers,
   wherein:
      the sense amplifiers are configured to be selectively simultaneously connected to a shared line;
      select line activation is performed as a function of a search query; and
      at least one of the select lines is configured to be driven by a signal selectively having a first voltage or a second voltage, wherein the first voltage is utilized for connecting one sense amplifier to the shared line for sensing one single bit per shared line and the second voltage is used for connecting a plurality of sense amplifiers simultaneously to the same shared line such that the shared line carries a signal directly dependent on data stored in the plurality of memory cells associated with the connected plurality of sense amplifiers.

2. The memory of claim 1, wherein an n-type transistor is used to connect the sense amplifier to the shared line, and wherein the first voltage is higher than the second voltage.

3. The memory of claim 1, wherein a p-type transistor is used to connect the sense amplifier to the shared line, and wherein the first voltage is lower than the second voltage.

4. The memory of claim 1, further comprising a sensing circuit operable to sense the voltage on the shared line.

5. The memory of claim 4, further comprising a search hit detection circuit operable to compare voltages on a first shared line and a second shared line to determine whether a search hit was detected.

6. The memory of claim 5, further comprising circuitry operable to provide a memory address location corresponding to a search hit in response to a search query.

7. The memory of claim 5, further comprising circuitry operable to provide contents of a memory address location corresponding to a search hit in response to a search query.

8. The memory of claim 1, wherein at least one select line is driven with a variable voltage determined as a function of a search query.

9. The memory of claim 1, wherein the select lines are driven sequentially or simultaneously such that a signal on the shared line is modified by at least two sense amplifiers before the shared line is reset or precharged.

10. The memory of claim 1, further comprising a selective ternary search function operable by setting a true bit and an complement bit in the memory cells for each logic zero and logic one level to be stored and searched and setting two bits to an identical value, either both true or both inverted, for each "don't care" state.

11. A method of controlling a content addressable dynamic random-access memory with parallel search functionality and a plurality of dynamic random-access memory cells, comprising:
   driving a plurality of select lines connected to a plurality of sense amplifiers, wherein the sense amplifiers are configured to simultaneously connect to and selectively drive a shared line;
   performing select line activation as a function of a search query; and
   enabling a local data line to connect to a hit detect amplifier, pulsing a search word onto the select lines, enabling a hit detect amplifier, and determining, via the hit detect amplifier, whether a hit was found.

12. The method of claim 11, further comprising enabling a second local data line to connect to a hit detect amplifier, pulsing a search word onto the select lines, enabling a hit detect amplifier, and determining, via the hit detect amplifier, whether a second hit was found.

13. The method of claim 12, further comprising comparing the first hit to the second hit and determining a true hit signal as a function of the comparison.

14. The method of claim 13, wherein the comparison includes summing the signals of the first hit and the second hit.

15. The method of claim 13, wherein the comparison includes performing a logical AND, NOR, or XNOR operation as a function of the signals of the first hit and the second hit.

16. The method of claim 11, further comprising driving the select lines sequentially or simultaneously such that a signal on the shared line is modified by at least two sense amplifiers before the shared line is reset or precharged.

17. The method of claim 11, further comprising enabling a selective ternary search function by setting a true bit and a complement bit in the memory cells for each bit of memory to be stored and searched, wherein a "don't care" state can be configured by setting the true bit and the complement bit to the same value.

* * * * *